United States Patent

Okuya et al.

(10) Patent No.: US 8,268,218 B2
(45) Date of Patent: Sep. 18, 2012

(54) RELEASE FILM FOR SEMICONDUCTOR RESIN MOLDS

(75) Inventors: Tamao Okuya, Tokyo (JP); Hiroshi Aruga, Tokyo (JP); Yoshiaki Higuchi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 122 days.

(21) Appl. No.: 12/644,855

(22) Filed: Dec. 22, 2009

(65) Prior Publication Data

US 2010/0096772 A1 Apr. 22, 2010

Related U.S. Application Data

(63) Continuation of application No. 12/258,520, filed on Oct. 27, 2008, now abandoned, which is a continuation of application No. PCT/JP2007/058648, filed on Apr. 20, 2007.

(30) Foreign Application Priority Data

Apr. 25, 2006 (JP) ................................. 2006-120573
Jul. 12, 2006 (JP) ................................. 2006-191872

(51) Int. Cl.
*B29C 45/14* (2006.01)

(52) U.S. Cl. .................................. 264/272.17; 264/275

(58) Field of Classification Search .................. None
See application file for complete search history.

(56) References Cited

U.S. PATENT DOCUMENTS

| | | | |
|---|---|---|---|
| 3,081,208 A | 3/1963 | Bottorf et al. | |
| 5,599,489 A | 2/1997 | Saiki et al. | |
| 5,846,477 A * | 12/1998 | Hotta et al. | 264/511 |
| 2003/0044552 A1 | 3/2003 | Komada | |

FOREIGN PATENT DOCUMENTS

| | | |
|---|---|---|
| EP | 1 612 021 A1 | 1/2006 |
| JP | 2001-250838 | 9/2001 |
| JP | 2002-361643 | 12/2002 |
| JP | 2002361643 | * 12/2002 |
| JP | 2004-79566 | 3/2004 |
| JP | 2006-49850 | 2/2006 |
| WO | WO 00/18555 | 4/2000 |

OTHER PUBLICATIONS

U.S. Appl. No. 13/114,204, filed May 24, 2011, Aruga.
U.S. Appl. No. 13/069,599, filed Mar. 23, 2011, Aruga.
Exteded European Search Report issued Nov. 2, 2010, in Application No. 07742083.4-2203 / 2012351 PCT/JP2007058648.

* cited by examiner

*Primary Examiner* — Edmund H. Lee
(74) *Attorney, Agent, or Firm* — Oblon, Spivak, McClelland, Maier & Neustadt, L.L.P.

(57) ABSTRACT

A process of sealing a semiconductor substrate by contacting the semiconductor substrate with a surface of a release layer (I) of a gas barrier release film that is in the form of a mold, which includes vacuum suction; injecting a sealing resin between the semiconductor substrate and the mold; and releasing said mold from said semiconductor substrate having said sealing resin present thereon, where the gas barrier release film has a release layer (I), which has excellent releasability; a plastic support layer (II) supporting the release layer; and a metal or a metal oxide gas restraint layer (III), present between the release layer and the support layer, where the gas barrier release film exhibits a xylene gas permeability of at most $5 \times 10^{-15}$ (kmol m/(s·m²·kPa)) at 170° C., and a surface of said release layer (I) has an arithmetic surface roughness of from 0.15 to 3.5 µm, exhibiting a satin-finish.

20 Claims, 3 Drawing Sheets

RELEASE FILM FOR SEMICONDUCTOR RESIN MOLDS

CROSS-REFERENCE TO RELATED APPLICATION

This application is a continuation of U.S. application Ser. No. 12/258,520, filed on Oct. 27, 2008, now abandoned, which is a continuation of PCT/JP07/005864, filed on Apr. 20, 2007, and claims priority to the following Japanese Patent Applications: JP 2006-120573, filed on Apr. 25, 2006 and JP 2006-191872, filed on Jul. 12, 2006.

TECHNICAL FIELD

The present invention relates to a release film for semiconductor resin molds, particularly a release film for semiconductor resin molds which can reduce mold contamination.

BACKGROUND ART

A semiconductor element (chip) is usually, for protection and blocking from an external environment (such as external air, contaminant, light, magnetism, high frequency wave or impulse), sealed with a resin (mold resin) and is mounted, on a substrate, in the form of a semiconductor package having the chip accommodated therein. Typically, the package is one formed by a transfer molding wherein a thermosetting resin (mold resin) such as an epoxy resin is melted by heating, and then, it is transferred in a mold where the semiconductor chip is set, followed by filling and curing. To the mold resin, a releasing agent is added in addition to a curing agent, a curing accelerator and a filler, to secure smooth releasability of the formed package from the mold.

On the other hand, along with a strong demand for improvement of productivity of a semiconductor package, there is a problem such that since the resin adheres to the mold, the contaminated mold needs to be often cleaned, or when a sealing resin having a low shrinkage corresponding to a large package is used, sufficient releasability cannot be obtained even if a releasing agent is added. Therefore, there has been a development made for a technique using a release film for resin molds (hereinafter referred to simply as a "release film"), wherein a semiconductor package is formed by injecting the resin into the mold in such a state that the resin molding portion (cavity surface) of the mold is covered with the release film without directly contacting the sealing resin to the cavity surface of the mold, and such technique has shown results of a certain level (e.g. Patent Documents 1 to 3).

However, recently, the mold resin to be used for a package of a semiconductor element is required to be changed to a non halogenated mold resin for environmental protection. Further, in order to meet the requirements for forming a semiconductor into a fine pitch model, slim model, multilayer chip package model or LED, there has been a further progress in forming a low viscosity mold resin or forming a mold resin into a liquid form resin. As a result, in the step of molding a resin for the semiconductor element, the amount of gas and low viscosity material formed from the molten mold resin under a high temperature environment increases, and the gas and low viscosity material permeating through the above release film for molds contact the mold having a high temperature, whereby the mold contamination becomes intense.

Further, covering the mold surface with the release film is carried out by sucking and supporting the film thereon under vacuum, but a volatile component such as an oligomer in the film transfers to the covered side of the mold, whereby the mold contamination may sometimes be caused.

Thus, even though the release film is used in such a manner, the side of the mold covered with the film, tends to be easily contaminated. Further, once the contamination is caused, the molding step for the semiconductor is required to be stopped for cleaning, and such leads to a problem such that the production efficiency of the semiconductor decreases.

Further, from such a viewpoint, the above Patent Documents 1 and 2 describe that in order to reduce the permeation of contaminants, a vapor-deposited layer of a metal or a metal oxide is formed on one side (a surface to be contacted with a mold surface) of the release film. However, such a metal deposited layer is one to be used by direct physical contact to the mold surface, and a metal powder tends to be released from the film surface or a broken section of the film, whereby its use for a molding step of the semiconductor resin is limited.

Further, in Patent Documents 1 and 2, the gas permeability of the release film is defined by a permeation of carbon dioxide gas, but such is not valid as an index for evaluating the permeability of a low viscosity material, etc. from a resin, etc.

Further, the release film is now required to have higher releasability from the mold resin, but such was not considered for the above release film, and the releasability was insufficient.

Further, in a case where a mold having a large surface roughness was used, when the release film is vacuum sucked to the mold before resin sealing, the release film was sometimes required to have a mold obsequence property whereby the release film is capable of being sufficiently stretched along the circumference length corresponding to the surface roughness of the mold.

Patent Document 1: JP-A-2002-361643 (Claims 1 to 3)
Patent Document 2: JP-A-2004-79566 (Claims 1 to 3)
Patent Document 3: JP-A-2001-250838 (Claims 1 to 6)

DISCLOSURE OF THE INVENTION

Objects to be Accomplished by the Invention

An object of the present invention is to provide a release film which is strongly demanded under the above circumstances, and which has extremely low gas permeability as compared with conventional ones and can substantially prevent mold contamination by a mold resin.

Another object of the present invention is to define a gas permeability required for a release film to effectively suppress the mold contamination, by using a gas permeability rate which is more realistically corresponding to a low viscosity material from a resin as a mold contaminant.

A further object of the present invention is to provide a release film having higher releasability from a mold resin.

Means to Accomplish the Objects

According to the present invention, the following laminate having an adhesive layer may be provided.

(1) A gas barrier release film for semiconductor resin molds, comprising a release layer (I) having excellent releasability, a plastic support layer (II) supporting the release layer, and a gas restraint layer (III) made of a metal or a metal oxide, formed between the release layer and the support layer, and having a xylene gas permeability of at most $10^{-15}$ (kmol·m/(s·m²·kPa)) at 170° C.

(2) The release film according to the above (1), wherein the above release layer (I) is formed from a fluororesin.

(3) The release film according to the above (2), wherein the above fluororesin is an ethylene/tetrafluoroethylene copolymer.

(4) The release film according to any one of the above (1) to (3), wherein the plastic support layer (II) has a stress at a 200% elongation of from 1 MPa to 100 MPa at 170° C.

(5) The release film according to any one of the above (1) to (4), wherein the plastic support layer (II) is formed from an ethylene/vinyl alcohol copolymer.

(6) The release film according to any one of the above (1) to (5), wherein the gas restraint layer (III) is formed on the plastic support layer (II).

(7) The release film according to any one of the above (1) to (6), wherein the gas restraint layer (III) is a layer of at least one oxide selected from a group consisting of aluminum oxide, silicon oxide and magnesium oxide.

(8) The release film according to any one of the above (1) to (6), wherein the gas restraint layer (III) is a layer of at least one metal selected from a group consisting of aluminum, tin, chrome or stainless steel.

(9) The release film according to any one of the above (1) to (8), wherein a resin protection layer (III') is formed on the gas restraint layer (III).

(10) The release film according to any one of the above (1) to (9), wherein at least one surface of the mold release film is satin-finished.

Effects of the Invention

According to the present invention, a release film can be provided which has extremely low gas permeability as compared with conventional ones and can substantially prevent mold contamination by a mold resin. Further, a gas permeability required for the release film to effectively suppress the mold contamination, is defined by a gas permeability rate corresponding more realistically to a low viscosity material from a resin as a mold contaminant. Further, according to the present invention, a release film having a higher releasability from a mold resin can be provided. Further, the release film of the present invention is excellent in mold obsequence property.

Therefore, by using the release film of the present invention in a molding step of the semiconductor resin, mold contamination is extremely low, and the number of times of mold cleaning can be reduced substantially, whereby it is possible to remarkably improve the production efficiency for molding a resin of a semiconductor element.

| MEANINGS OF SYMBOLS | |
|---|---|
| 1: | Gas barrier release film |
| I: | Release layer |
| II: | Plastic support layer |
| III: | Gas restraint layer (gas permeation suppressing layer) such as metal oxide-deposited layer |
| III': | Resin protection layer |

BEST MODE FOR CARRYING OUT THE INVENTION

Now, the present invention will be described in detail.

Figure 1:
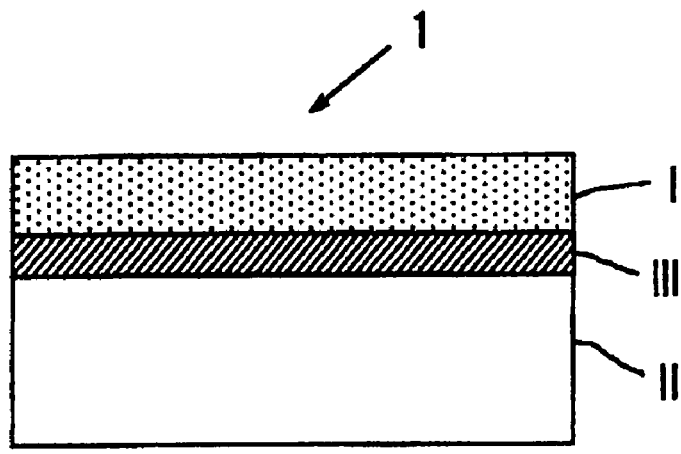
FIG. 1 is a cross-sectional view illustrating a layer structure of a gas barrier release film of the present invention.

As shown in FIG. 1, the release film 1 for semiconductor resin molds of the present invention comprises at least a release layer (I) excellent in releasability and a plastic support layer (II) supporting the release layer, and it has a layer structure such that a gas restraint layer (III) made of a metal or a metal oxide is formed between the release layer and the support layer, and also has a xylene gas permeability of at most $10^{-15}$ (kmol·m/(s·m$^2$·kPa)) at 170° C.

Release Layer (I)

The release layer (I) in the release film of the present invention is a layer which is disposed to face a surface of the semiconductor element to be sealed, and which is a layer to be contacted with a mold resin injected in a mold. It is also a layer to impart a sufficient releasability from a cured mold resin.

A resin to form the release layer is not particularly limited as long as it is one having a releasability from a mold resin such as an epoxy resin, but the release layer is preferably formed from a fluororesin having particularly excellent releasability.

The fluororesin may, for example, be an ethylene/tetrafluoroethylene copolymer (hereinafter referred to as "ETFE"), a chlorotrifluoroethylene resin (hereinafter referred to as "CTFE"), a polytetrafluoroethylene (hereinafter referred to as "PTFE"), a vinylidene fluoride resin (hereinafter referred to as "VdF"), a vinyl fluoride resin (hereinafter referred to as "VF"), a tetrafluoroethylene/hexafluoropropylene copolymer (hereinafter referred to as "FEP"), a tetrafluoroethylene/perfluoro(propyl vinyl ether) copolymer (hereinafter referred to as "PFA"), a tetrafluoroethylene/vinylidene fluoride copolymer or a combination of such resins. Preferred are ETFE, PTFE, FEP and PFA, and more preferred is ETFE. Further, ETFE may contain repeating units derived from at least one type of other monomers within a range not to impair its essential characteristics of imparting a releasability. Other monomers may, for example, be an α-olefin such as propylene or butene; a compound represented by $CH_2=CX(CF_2)_nY$ (wherein each of X and Y is independently an is hydrogen or fluorine atom, and n is an integer of from 1 to 8); a fluoroolefin having an hydrogen atom in an unsaturated group, such as vinylidene fluoride, vinyl fluoride, difluoroethylene (DFE), trifluoroethylene (TFE), pentafluoropropylene (PFP) or hexafluoroisobutylene (HFIB); and a fluoroolefin having no hydrogen atom in an unsaturated group, such as hexafluoropropylene (HFP), chlorotrifluoroethylene (CTFE), perfluoro(methyl vinyl ether) (PMVE), perfluoro(ethyl vinyl ether) (PEVE), perfluoro(propyl vinyl ether) (PPVE), perfluoro(butyl vinyl ether) (PBVE) or other perfluoro(alkyl vinyl ether) (PAVE). Such other monomers may be used alone or in combination as a mixture of two or more of them.

In the release film 1 of the present invention, as shown in FIG. 1, the release layer (I) is supported by the plastic support layer (II) having necessary stiffness, whereby the thickness of the release layer may be as thin as just enough to impart a releasability. Usually, the thickness is from 3 to 75 μm, preferably from 6 to 30 μm. Further, in FIG. 1, (III) is a gas restraint layer, which will be described later.

Figure 2:
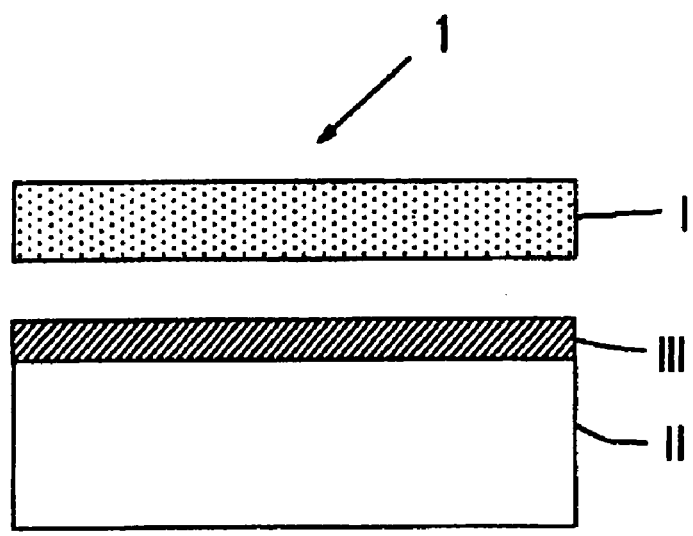
FIG. 2 is a cross-sectional view illustrating a layer structure of a gas barrier release film of the present invention.

Further, as shown in FIG. 2, in the release film, the surface of the release layer (I) to be laminated and adhered on the gas restraint layer (III), facing the support layer (II), is preferably surface-treated by a common method to improve the adhesion. The surface-treating method may, for example, be a known corona discharge treatment in air, corona discharge treatment in the presence of an organic compound, plasma discharge treatment in the presence of an organic compound or discharge treatment in a gas mixture of inert gas, polymerizable unsaturated compound gas and hydrocarbon oxide gas, and it is particularly preferably the corona discharge treatment in air.

Plastic Support Layer (II)

The plastic support layer (II) in the release film of the present invention is a layer which supports the release layer laminated thereon and which imparts necessary stiffness or strength to the release film. Further, by laminating the release layer (I) on the support layer, it is possible to reduce the amount of expensive ETFE, etc.

A resin to form such a plastic support layer (II) is not particularly limited, but one used for a common release film is preferably used. It may, for example, be a polyester resin such as polyethylene terephthalate, polyethylene naphthalate or polybutyrene terephthalate, a polyamide such as 6-nylon, 6,6-nylon or 12-nylon, a polyimide, a polyamideimide, a polyolefin such as high density polyethylene or polypropylene, an acryl resin, a polycarbonate, a polyether sulfone, a polyether imide, a polyphenylene sulfide or an ethylene/vinyl alcohol copolymer. Among them, a polyester resin is preferred, and polyethylene terephthalate is more preferred. Further, it may be a stretched or unstretched film.

Further, the plastic support layer (II) preferably has a stress at a 200% elongation of from 1 MPa to 100 MPa at 170° C. If the strength of the support layer is higher than such a range, the release film will not have a sufficient elongation, whereby when a mold having a large surface roughness is used, there will be a gap between the mold and the vacuum-sucked release film, and such will be a cause of breakage of the release film or leakage of a resin.

Further, if the strength is smaller than such a range, the resin of the plastic support layer may leak out of the release film by the pressure of the sealing resin, etc. and may contaminate the device, although such may depend on the thickness of the plastic support layer. When the plastic support layer has the elongation strength in the above range, the release film will be flexible at a high temperature and will be excellent in mold obsequence property for a mold having a large surface roughness.

Thus, when the mold obsequence property is particularly required for the release film, as in the case of the mold having a large surface roughness, the plastic support layer (II) is preferably constituted by a resin such as an ethylene/vinyl alcohol copolymer.

The thickness of the plastic film or plastic sheet constituting the plastic support layer (II) is not particularly limited, but it is usually from 1 to 300 μm preferably from 6 to 200 μm, more preferably from 10 to 100 μm.

Gas Restraint Layer (III) Made of Metal or Metal Oxide

The release film of the present invention is characterized in that, e.g. as shown in FIG. 1, a gas restraint layer (III) made of a metal or a metal oxide is formed between the release film (I) and the plastic support layer (II).

The metal to form the gas restraint layer (III) may, for example, be aluminum, tin, chrome or stainless steel, and the metal oxide may, for example, be aluminum oxide, silicon oxide, magnesium oxide or zirconium oxide. Among them, preferred are aluminum oxide, silicon oxide and magnesium oxide, and more preferred are aluminum oxide and silicon oxide. When the gas restraint layer is formed by such a metal oxide, the release film will be excellent in a gas barrier property, and mold contamination in a molding step of a semiconductor resin will be minimized, such being preferred.

In a case where the gas restraint layer (III) made of such a metal oxide is to be formed, e.g. as shown in FIG. 2, it may be formed on the plastic film as the plastic support layer (II) by a common thin-film forming method such as vacuum deposition, sputtering, chemical vapor deposition (CVD) or ion plating. On the gas restraint layer, the ETFE resin film as the release layer (I) is laminated and adhered, preferably through an adhesive, by a method such as dry-laminating, thermal curing or UV curing, thereby to obtain a release film. Further, it is possible to dry-laminate a metal foil such as aluminum on a support layer.

The thickness of the gas restraint layer (III) made of a metal oxide is usually from 1 to 100 nm, preferably from 5 to 50 nm, more preferably from 10 to 30 nm. If the thickness is thinner than such a range, a sufficient gas barrier effect will not be achieved. If the thickness exceeds such a range, no extra gas barrier effect is achieved, and handling efficiency as the release film tends to deteriorate, such being undesirable.

Resin Protection Layer (III')

In the release film of the present invention, it is also preferred that on the gas restraint layer (III) made of a metal or a metal oxide, a resin protection layer (III') is formed for protection from an external impact, etc.

Figure 3:
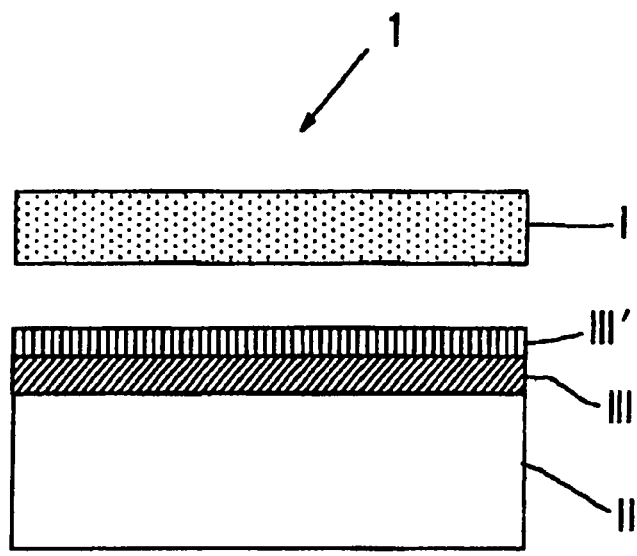
FIG. 3 is a cross-sectional view illustrating a layer structure of a gas barrier release film of the present invention.

Such a resin protection layer (III') is not particularly limited as long as it is one which, as shown in FIG. 3, can be formed on the gas restraint layer (III) formed on a plastic film as the plastic support layer (II) by a coating method such as coating, printing or dipping. It may, for example, be a resin such as a melamine resin, an acryl resin, polyvinylidene chloride, an ethylene/vinyl alcohol resin or a polyvinyl alcohol resin. Among them, a melamine resin or an acryl resin is more preferred, and a melamine resin is most preferred.

Further, it is sometimes possible to form the resin protection layer (III') by amorphous carbon.

The thickness of the protection layer (III') is usually from 1 to 1,500 nm, preferably from 10 to 1,000 nm, more preferably from 50 to 400 nm.

Xylene Gas Permeability

The release film of the present invention is a gas barrier release film for semiconductor resin molds having a xylene gas permeability of at most $10^{-15}$ (kmol·m/(s·m²·kPa)) at 170° C. Usually, the gas permeability of the release film is preferably evaluated as a permeability of a low viscosity material or the like from an epoxy resin or the like as a mold resin through the film. It used to be evaluated by the film permeability of carbon dioxide gas as described in the above-mentioned Patent Documents 1 and 2. However, the low viscosity material and the carbon dioxide gas are significantly different as chemical materials, and their correlativity was not sufficient. Under the circumstance, the present inventors have found that the film permeability of xylene vapor (gas) at 170° C. can suitably be related to a gas permeability of a material derived from an epoxy resin. Namely, the permeability coefficient of xylene gas is a suitable index of a barrier property against an organic product formed from a mold resin for a semiconductor such as an epoxy resin. They have also found that the smaller the value, the smaller the mold contamination in the molding step of a semiconductor resin.

Further, in the present invention, the present inventors have found that by adjusting the gas permeability of the release film to the specific value, specifically, adjusting a xylene gas permeability to at most $10^{-15}$ (kmol·m/(s·m²·kPa)), preferably at most $5 \times 10^{-15}$ (kmol·m/(s·m²·kPa)) at 170° C., it is possible to remarkably reduce the contamination of the mold.

In the present invention, as described in the following Examples, the gas permeability of the release film is one obtained in such a manner that a communication port (opening) of upper and lower cells is closed with a film for permeability measurement (sample film); xylene gas is introduced in the upper cell kept at 170° C.; through the sample film, the xylene gas is permitted to permeate to the lower cell kept under vacuum; the change with time of the concentration (pressure) of the permeated xylene gas is measured; and from the pressure change in such a steady state, it is calculated as a permeability coefficient of xylene gas in an environment at 170° C.

Layer Structure of Release Film

Figure 4:
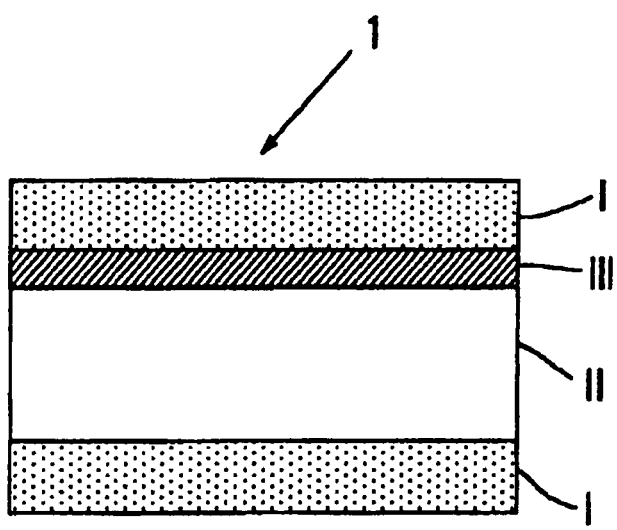
FIG. 4 is a cross-sectional view illustrating a layer structure of a gas barrier release film of the present invention.
Figure 5:
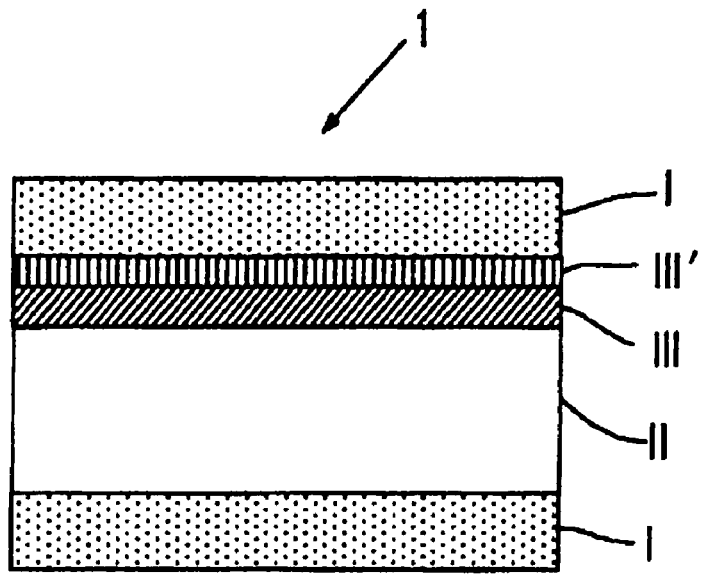
FIG. 5 is a cross-sectional view illustrating a layer structure of a gas barrier release film of the present invention.
Figure 6:
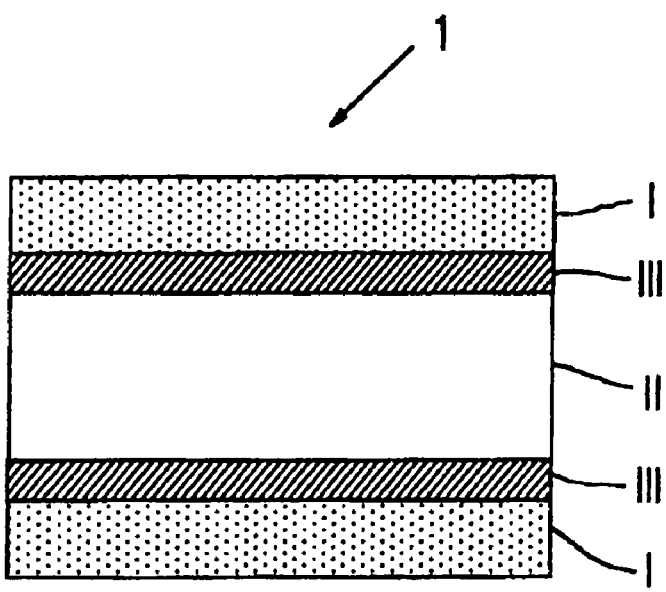
FIG. 6 is a cross-sectional view illustrating a layer structure of a gas barrier release film of the present invention.

As shown in FIG. 1, the release film of the present invention fundamentally has a layer structure comprising a release layer (I)/a gas restraint layer (III)/a plastic support layer (II). However, it may be a film having a layer structure comprising, as shown in FIG. 3, a release layer (I)/a resin protection layer (III')/a gas restraint layer (III)/a plastic support layer (II); as shown in FIG. 4, a release layer (I)/a gas restraint layer (III)/a plastic support layer (II)/a release layer (I); as shown in FIG. 5, a release layer (I)/a resin protection layer (III')/a gas restraint layer (III)/a plastic support layer (II)/a release layer (I); or as shown in FIG. 6, a release layer (I)/a gas restraint layer (III)/a plastic support layer (II)/a gas restraint layer (III)/a release layer (I). Further, the gas restraint layer (III) and the resin protection layer (III') may be laminated into a multilayer, and in such a case, the gas restraint layer (III) and the resin protection layer (III') may be laminated on the resin protection layer (III') which is on the plastic support layer (II).

In any one of the layer structures, an adhesive layer may be present between the release layer (I) and the gas restraint layer (III) or between the release layer (I) and the resin protection layer (III'). The adhesive to form the adhesive layer may, for example, be an isocyanate type, a polyurethane type or a polyester type. The adhesive layer is preferably in a range of from 0.1 to 5 μm, more preferably from 0.2 to 2 μm, as dried.

Further, the sequence of lamination is not particularly limited, but it is preferred to form the gas restraint layer (III) on the plastic support layer (II) by a method such as vacuum deposition and further to laminate the release layer (I) thereon. In such a case, as shown in FIG. 3, it is also preferred to further form the resin protection layer (III') on the gas restraint layer (III), and then to laminate the release layer (I) thereon.

Further, with respect to the release film of the present invention, since it is sucked to a mold surface at usage, the gas restraint layer (III), etc. may be provided on the side closer to the mold surface in order to reduce the transfer of the release film components to the mold surface.

Thickness of Each Layer

In summary, with respect to the thickness of each layer of the gas barrier release film of the present invention, the release layer (I) is usually from 3 to 75 μm, preferably from 6 to 30 μm; the plastic support layer (II) is usually from 1 to 300 μm, preferably from 6 to 200 μm, more preferably from 10 to 100 μm; the gas restraint layer (III) formed on the plastic support layer is usually from 1 to 100 nm, preferably from 5 to 50 nm, more preferably from 10 to 30 nm; and the resin protection layer (III') formed on the gas restraint layer (III) is usually from 1 to 1,500 nm, preferably from 10 to 1,000 nm, more preferably from 50 to 400 nm.

Satin Finishing

In the release film of the present invention, the release layer (I) as a surface layer and the plastic support layer may be satin-finished. When it is satin-finished, the surface layer has an arithmetic surface roughness preferably in a range of from 0.01 to 3.5 μm, more preferably in a range of from 0.15 to 2.5 μm. When the surface roughness is in such a range, a molded product will be prevented from having a poor appearance, the yield will be improved, and the visibility of a lot number marked on the molded product will be improved.

Molding

The release film for semiconductor molds of the present invention may be used in the same manner as the conventional release film, in the step of molding a resin for a semiconductor element. That is, the semiconductor element to be molded and the release film are set at the prescribed positions in the mold; after closing the mold, the release film is sucked to the mold surface by vacuum suction; and a mold resin is injection-molded between the semiconductor element and the release film for semiconductor molds, covering the mold surface. It is easy to release the cured mold resin from the release film of the present invention.

EXAMPLES

Now, the present invention will be described in further detail with reference to Examples. Further, the xylene gas permeability coefficient was measured as follows.

Method for Measuring Xylene Gas Permeability Coefficient (kmol·m/(s·m²·kPa))

It was measured in accordance with JIS K 7126-1987 by a differential-pressure method. Here, the testing temperature was 170° C., the sample gas was xylene gas, the high pressure-side pressure was 5 kPa, and the diameter of permeation surface of a sample film was 50 mm.

Xylene gas was introduced in an upper cell kept at 170° C.; through a film for permeability measurement (sample film), xylene gas was permitted to permeate to a lower cell kept under vacuum; the change with time of the concentration (pressure) of the permeated xylene gas was measured; and from the pressure change in such a steady state, the permeability coefficient of xylene gas under an environment at 170° C. was calculated.

Example 1

(1) As the release layer (I), an ETFE film (manufactured by Asahi Glass Company, Limited, tradename: FLUON ETFE) having a thickness of 12 μm was used. One side (surface (surface to be bonded) facing a support layer) of the ETFE film was treated by corona discharge-treatment with a discharge amount of 40 W·min/m² to improve the adhesion.

Further, a 12 μm polyethylene terephthalate film was used as the plastic support layer (II), and on one side of it, alumina was vapor-deposited as a metal oxide to form a gas restraint layer (III). Further, on it, a resin protection layer (III') was coated to form a film (manufactured by Toppan Printing Co., Ltd., tradename: GX Film).

(2) On the surface of the resin protection layer (III') of the above film (GX Film), a polyester adhesive was applied to have a film thickness of 0.4 μm as dried, followed by drying, and as shown in FIG. 3, dry-laminating with a release layer (I)

was carried out to obtain a release film (hereinafter referred to as "release film 1") having a layer structure ((I)/(III')/(III)/(II)).

(3) With respect to the obtained release film 1, by the above-mentioned method, the xylene gas permeability coefficient in an environment at 170° C. was measured. The result is shown in Table 1.

(4) The releasability of the above obtained release film 1 from an epoxy resin for molding was measured as follows. That is, between the release film 1 and Kapton film (polyimide film, manufactured by Du Pont Kabushiki Kaisha) (reference film) as a substrate material for a flexible printed substrate, Al cut out in a square frame form having a thickness of 0.1 mm was set as a frame (spacer), and the epoxy resin for a semiconductor mold was injected in the Al frame. In an environment at 175° C., the release film 1 and the Kapton film were pressed and adhered to each other by the epoxy resin for a mold (wherein the release layer (I) of the release film 1 was disposed to be in contact with the epoxy resin). The release film 1 having the resin for a semiconductor mold adhered thereto was cut into stripes having a width of 25 mm. By peeling its end portion, a 180° peel test from the semiconductor mold resin was carried out to measure a peel strength. The result is shown in Table 1.

(5) A non-molded substrate was set in a lower mold for transfer mold in an environment at 175° C., and the release film 1 was vacuum-sucked to an upper mold. Then, the upper and lower molds were closed, and an epoxy resin for a semiconductor mold was transfer-molded at 7 MPa for 90 sec. A mold shot was repeated under the above conditions, and when a contamination of the mold was visually checked, there was no mold contamination observed even though 2,000 times of mold shots were repeated.

Comparative Example 1

(1) A simple ETFE film (manufactured by (manufactured by Asahi Glass Company, Limited, tradename: FLUON ETFE) having a thickness of 50 μm was used as it is as a release film sample (hereinafter referred to as "release film 2") for a test.

(2) The xylene gas permeability coefficient under an environment at 170° C. was calculated in the same manner as in Examples except for using the release film 2 instead of using the above release film 1. Further, the 180° peel test was carried out in the same manner as in Example 1. The result is shown in Table 1.

(3) Further, in the same manner in Example 1, when a mold shot was repeatedly carried out by using the release film 2, a mold contamination became apparent less than 2,000 times of mold shots.

Example 2

(1) A release film (hereinafter referred to as "release film 3") was obtained in the same manner as in Example 1 except that a 12 μm ethylene/vinyl alcohol copolymer (manufactured by Kuraray Co., Ltd., tradename: EVAL EF-F) was used as the plastic support layer (II), and on its one side, aluminum was sputtered in a thickness of 10 nm to form a gas restraint layer (III), and no resin protection layer (III') was formed.

(2) With respect to the release film 3, the xylene gas permeability coefficient in an environment at 170° C. was calculated in the same manner as in Examples. Further, the peel strength was measured by a 180° C. peel test in the same manner as in Example 1.

The xylene gas permeability coefficient of the release film 3 was $1 \times 10^{-16}$ (kmol·m/(s·m$^2$·kPa)), the peel strength by a 180° peel test was 0 (N/m). The result is shown in Table 1.

(3) Further, in the same manner as in Example 1, a mold shot was repeatedly carried out by using the release film 3, and no mold contamination was observed even though a mold shot was repeated at least 2,000 times.

(4) In a case where a mold having a cavity was kept at 170° C., and the release film 3 was vacuum-sucked to the cavity portion of the mold, whereby there was little space between the release film and the mold. Therefore, it was evident that the mold obsequence property was excellent as in Example 1.

TABLE 1

| Experimental number | Release film | Xylene gas permeability coefficient (kmol · m/(s · m$^2$ · kPa)) | 180° peel test |
|---|---|---|---|
| Ex. 1 | Release film 1 | $8 \times 10^{-17}$ | 0 |
| Ex. 2 | Release film 3 | $1 \times 10^{-16}$ | 0 |
| Comp. Ex. 1 | Release film 2 | $1 \times 10^{-14}$ | 0 |

According to Examples 1 and 2 of the present invention and Comparative Example 1 in Table 1, the release film 1 and 3 of the present invention are excellent in releasability from an epoxy resin for a semiconductor mold as is a parent from the 180° peel test (N/cm). Moreover, their xylene gas permeability coefficients, such as $8 \times 10^{-17}$ (kmol·m/(s·m$^2$·kPa)) and $1 \times 10^{-16}$ (kmol·m/(s·m$^2$·kPa)), respectively, are much smaller than the value defined in the present invention. Therefore, in the transfer mold test using the release film 1 or 3, each case showed an excellent effect such that no mold contamination was observed even though the test was repeated for at least 2,000 times.

On the other hand, when an ETFE film itself was used as the release film 2, the releasability was excellent, but the xylene gas permeability coefficient was poor such as $1 \times 10^{-14}$ (kmol·m/(s·m$^2$·kPa)), as compared with the value defined in the present invention. As expected, in the transfer mold test using the release film 2, a mold contamination became apparent less than 2,000 times of the test.

Industrial Applicability

According to the present invention, a release film will be provided, which has extremely low gas permeability and can substantially prevent mold contamination by a mold resin, as compared with conventional ones, and which has a releasability from the mold resin.

Therefore, by using the gas barrier release film of the present invention, it is possible to drastically reduce mold contamination and number of times of cleaning the mold in the step of molding a resin for a semiconductor, and it is possible to significantly increase the production efficiency for molding a resin for a semiconductor. Therefore, the industrial applicability is extremely high.

The release film of the present invention is particularly useful for an application of molding a resin for a semiconductor, but it is suitably applicable to various other applications which need releasability.

The entire disclosures of Japanese Patent Application No. 2006-120573 filed on Apr. 25, 2006 and Japanese Patent Application No. 2006-191872 filed on Jul. 12, 2006 including specifications, claims, drawings and summaries are incorporated herein by reference in their entireties.

What is claimed is:

1. A process, comprising:
contacting a semiconductor substrate with a surface of a release layer (I) of a gas barrier release film by vacuum suction, where said gas barrier release film is in the form of a mold;
injecting a sealing resin between said semiconductor substrate and said mold; and
releasing said mold from said semiconductor substrate having said sealing resin present thereon, thereby obtaining a semiconductor substrate sealed with the sealing resin,
wherein
said gas barrier release film comprises:
said release layer (I), which is an ethylene/tetrafluoroethylene fluororesin;
a plastic support layer (II); and
a metal or a metal oxide gas restraint layer (III), present between the release layer (I) and the support layer (II), wherein
said gas barrier release film exhibits a xylene gas permeability of at most $5\times10^{-15}$ (kmol m/(s·m$^2$·kPa)) at 170° C., and
said a surface of said release layer (I) has an arithmetic surface roughness of from 0.15 to 3.5 μm, thereby exhibiting a satin-finish.

2. The process according to claim 1, wherein the plastic support layer (II) has a stress at a 200% elongation of from 1 MPa to 100 MPa at 170° C.

3. The process according to claim 1, wherein the plastic of said plastic support layer (II) is an ethylene/vinyl alcohol copolymer.

4. The process according to claim 1, wherein the gas restraint layer (III) is present on the plastic support layer (II).

5. The process according to claim 1, wherein the gas restraint layer (III) is a layer of at least one oxide selected from a group consisting of aluminum oxide, silicon oxide and magnesium oxide.

6. The process according to claim 1, wherein the gas restraint layer (III) is a layer of at least one metal selected from a group consisting of aluminum, tin, chrome or stainless steel.

7. The process according to claim 1, further comprising a resin protection layer (III') present on the gas restraint layer (III).

8. The process according to claim 1, wherein said arithmetic surface roughness is from 0.15 to 2.5 μm.

9. The process according to claim 1, wherein said gas restraint layer (III) is disposed on said plastic support layer (II), and said release layer (I) is disposed on said gas restraint layer (III).

10. The process according to claim 1, wherein said gas barrier release film exhibits a xylene gas permeability of from $8\times10^{-17}$ to $5\times10^{-15}$ (kmol m/(s·m$^2$·kPa)) at 170° C.

11. The process according to claim 1, wherein said sealing resin is an epoxy resin.

12. The process according to claim 1, wherein said release layer (I) has a thickness of from 3 to 75 μm.

13. The process according to claim 1, wherein said plastic support layer (II) has a thickness of from 1 to 300 μm.

14. The process according to claim 1, wherein said gas restraint layer (III) has a thickness of from 1 to 100 nm.

15. The process according to claim 1, wherein said a surface of said release layer (I) has an arithmetic surface roughness of from 0.15 to 2.5 μm.

16. A process, comprising:
contacting a semiconductor substrate with a surface of a release layer (I) of a gas barrier release film by vacuum suction, where said gas barrier release film is in the form of a mold;
injecting a sealing resin between said semiconductor substrate and said mold; and
releasing said mold from said semiconductor substrate having said sealing resin present thereon, thereby obtaining a semiconductor substrate sealed with the sealing resin,
wherein
said gas barrier release film comprises:
said release layer (I), which comprises an ethylene/tetrafluoroethylene fluororesin;
a plastic support layer (II), which is comprises of one of polyethylene terephthalate and an ethylene/vinyl alcohol copolymer; and
a gas restraint layer (III), which is a layer of alumina or aluminum and the gas restraint layer (III) is present between the release layer (I) and the support layer (II),
said gas barrier release film exhibits a xylene gas permeability of from $8\times10^{-17}$ to $1\times10^{-16}$ (kmol m/(s·m$^2$·kPa)) at 170° C., and
said surface of said release layer (I) has an arithmetic surface roughness of from 0.15 to 3.5 μm, thereby exhibiting a satin-finish.

17. The process according to claim 16, wherein said release layer (I) has a thickness of from 3 to 75 μm.

18. The process according to claim 16, wherein said plastic support layer (II) has a thickness of from 1 to 300 μm.

19. The process according to claim 16, wherein said gas restraint layer (III) has a thickness of from 1 to 100 nm.

20. The process according to claim 16, wherein said a surface of said release layer (I) has an arithmetic surface roughness of from 0.15 to 2.5 μm.

* * * * *